United States Patent
Kogure et al.

(10) Patent No.: US 8,638,117 B2
(45) Date of Patent: Jan. 28, 2014

(54) PRODUCTION DEVICE, PRODUCTION METHOD, TEST APPARATUS AND INTEGRATED CIRCUIT PACKAGE

(75) Inventors: Yoshinari Kogure, Saitama (JP); Seiichi Takasu, Shiga (JP); Sadaki Tanaka, Shiga (JP)

(73) Assignee: Advantest Corporation, Tokyo (JP)

( * ) Notice: Subject to any disclaimer, the term of this patent is extended or adjusted under 35 U.S.C. 154(b) by 366 days.

(21) Appl. No.: 12/878,993

(22) Filed: Sep. 9, 2010

(65) Prior Publication Data

US 2011/0089550 A1  Apr. 21, 2011

(30) Foreign Application Priority Data

Oct. 19, 2009  (JP) .................................. 2009-240882

(51) Int. Cl.
  *H01L 31/20*  (2006.01)

(52) U.S. Cl.
  USPC ................... 324/757.01; 324/757.04; 438/15

(58) Field of Classification Search
  USPC ......... 438/14, 15, 106, 107, 121; 324/756.01, 324/757.01, 757.04
  See application file for complete search history.

(56) References Cited

U.S. PATENT DOCUMENTS

| 6,340,838 | B1 | 1/2002 | Chung et al. |
| 6,753,253 | B1* | 6/2004 | Takahashi et al. ............ 438/676 |
| 8,017,434 | B2* | 9/2011 | Lim et al. ...................... 438/106 |
| 2004/0183910 | A1* | 9/2004 | Shida et al. ................... 348/180 |
| 2006/0132155 | A1 | 6/2006 | Yamada et al. |
| 2009/0183363 | A1 | 7/2009 | Yamada et al. |
| 2011/0043231 | A1* | 2/2011 | Richter et al. ........... 324/750.05 |

FOREIGN PATENT DOCUMENTS

| JP | H1068758 | 3/1998 |
| JP | 11-326449 A | 11/1999 |
| JP | 2006135044 | 5/2006 |
| JP | 2006-173503 A | 6/2006 |
| JP | 2009212254 | 9/2009 |

OTHER PUBLICATIONS

JP Office Action and English Translation Dated Aug. 27, 2013; Application No. 2009-240882.

* cited by examiner

*Primary Examiner* — S. V. Clark (57) ABSTRACT

Provided is a manufacturing apparatus that manufactures an integrated circuit package by packaging an integrated circuit chip, the manufacturing apparatus comprising a flattening section that flattens the integrated circuit chip; a holding section that holds a base substrate; a transporting section that transports the flattened integrated circuit chip to load the integrated circuit chip on the base substrate held by the holding section; and a packaging section that packages the integrated circuit chip and the base substrate as the integrated circuit package.

16 Claims, 13 Drawing Sheets

PRODUCTION DEVICE, PRODUCTION METHOD, TEST APPARATUS AND INTEGRATED CIRCUIT PACKAGE

BACKGROUND

1. Technical Field

The present invention relates to a manufacturing apparatus, a test apparatus, a manufacturing method, and an integrated circuit package.

2. Related Art

A known apparatus for testing a plurality of devices formed on a semiconductor wafer uses a probe card that can contact many electrodes of the wafer at once, as shown in Patent Document 1, for example. In this apparatus, the wafer under test in contact with a probe card is placed in an examination apparatus, and examination is performed at a high temperature. Patent Document 2 describes an apparatus that stores chips in packages having the same form as a commercial package, and tests these packages.

Patent Document 1: Japanese Patent Application Publication No. 2006-173503

Patent Document 2: Japanese Patent No. 4122102

In the above apparatuses, however, a large amount of wiring must be connected to manufacture the probe card, and this incurs a high cost. Furthermore, in the above apparatuses, adjusting the relative positions of the wafer under test and the probe card is difficult. If a chip that has been cut is stored in a package having the same form as a commercial package and then tested, the packaging configuration becomes complicated and the cost of the package increases. In addition, warping occurs in the chips after cutting. In such cases, an accurate connection cannot be achieved between the electrodes of the chip and the terminals of the package.

SUMMARY

Therefore, it is an object of an aspect of the innovations herein to provide a manufacturing apparatus, a test apparatus, and a manufacturing method, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, one exemplary manufacturing apparatus may include a manufacturing apparatus that manufactures an integrated circuit package by packaging an integrated circuit chip, the manufacturing apparatus comprising a flattening section that flattens the integrated circuit chip; a holding section that holds a base substrate; a transporting section that transports the flattened integrated circuit chip to load the integrated circuit chip on the base substrate held by the holding section; and a packaging section that packages the integrated circuit chip and the base substrate as the integrated circuit package. Also provided by the first aspect are a test apparatus and a manufacturing method.

According to a second aspect related to the innovations herein, one exemplary integrated circuit package may comprise an integrated circuit chip; a base film that has a base internal terminal connected to the integrated circuit chip; a base frame substrate that has a base external terminal connected to an external circuit and that holds an outer circumference of the base film; a top film that covers the integrated circuit chip from a side opposite the base film; and a top frame substrate that holds an outer circumference of the top film.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
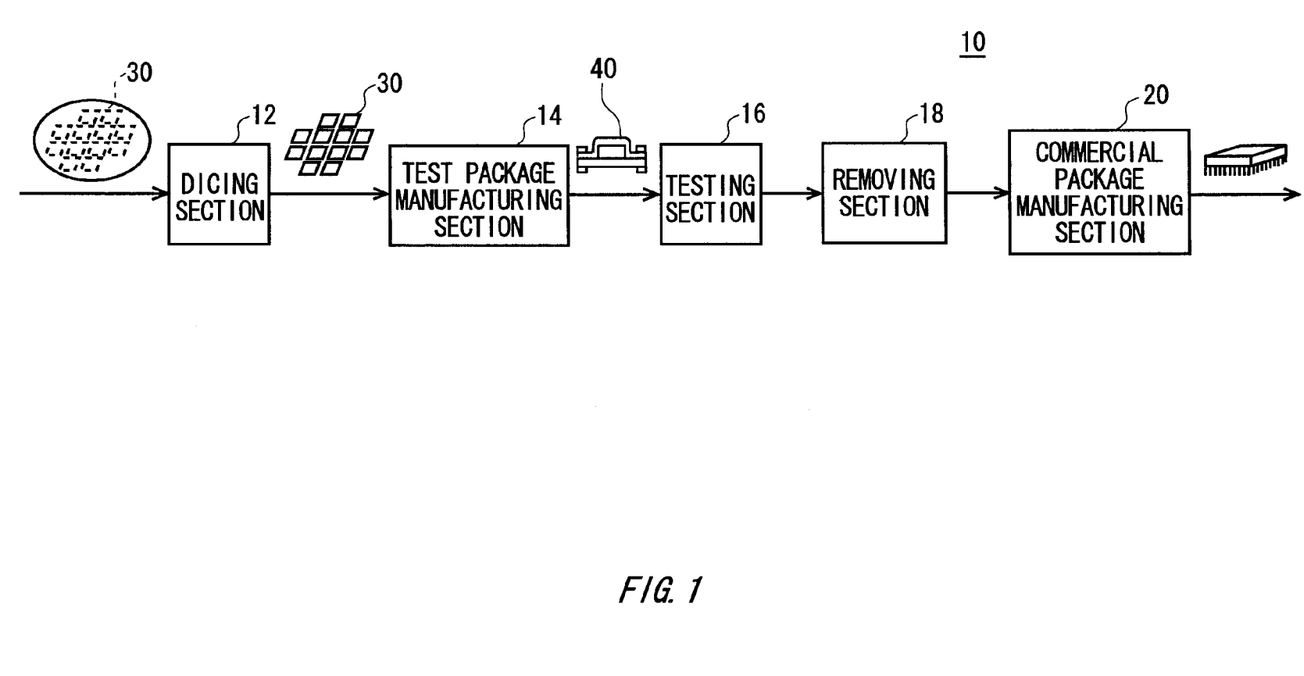
FIG. 1 shows a configuration of a device manufacturing system 10 according to an embodiment of the present invention.

FIG. 1 shows a configuration of a device manufacturing system 10 according to an embodiment of the present invention. The device manufacturing system 10 manufactures a packaged device from a circular wafer on which a plurality of integrated circuit chips 30 are formed. The device manufacturing system 10 includes a dicing section 12, a test package manufacturing section 14, a testing section 16, a removing section 18, and a commercial package manufacturing section 20.

The dicing section 12 dices the integrated circuit chips 30 from the wafer. The test package manufacturing section 14 packages each integrated circuit chip 30 diced by the dicing section 12 for testing, thereby creating integrated circuit packages 40.

The testing section 16 tests the integrated circuit packages 40, which are formed of the packaged integrated circuit chips 30, as the devices under test. The testing section 16 may be a test apparatus that tests a semiconductor device or the like.

The removing section 18 removes the integrated circuit chips 30 from the tested integrated circuit packages 40. The commercial package manufacturing section 20 packages the removed integrated circuit chips 30 in commercial packages. With this device manufacturing system 10, the testing is performed on the integrated circuit chips 30, and so the acceptability of the devices can be judged prior to commercial packaging. As a result, the device manufacturing system 10 can improve the manufacturing efficiency.

Figure 2:
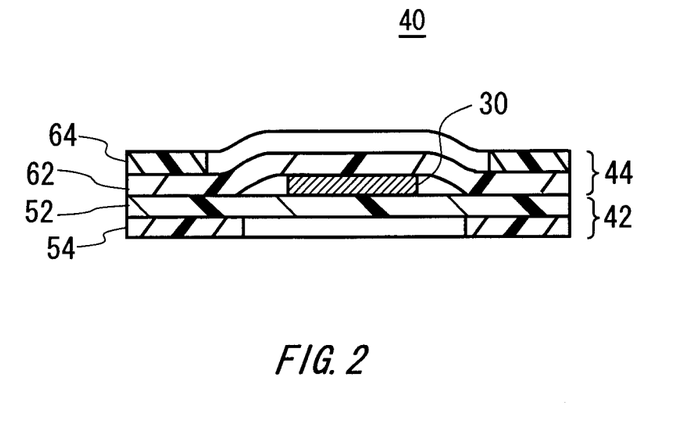
FIG. 2 shows an exemplary cross section of an integrated circuit package 40 manufactured by the device manufacturing system 10 according to the present embodiment.

FIG. 2 shows an exemplary cross section of an integrated circuit package 40 manufactured by the device manufacturing system 10 according to the present embodiment. The integrated circuit package 40 includes an integrated circuit chip 30, a base substrate 42, and a top substrate 44.

The base substrate 42 and the top substrate 44 are thin boards with planar surfaces that are larger than the integrated circuit chip 30. At least one of the base substrate 42 and the top substrate 44 has a central region that is more pliable than an edge region thereof.

The integrated circuit chip 30 is loaded on the approximate center of the planar surface of the base substrate 42, which is the pliable region. The top substrate 44 is then layered from the integrated circuit chip 30 side onto the base substrate 42, while the integrated circuit chip 30 is loaded thereon, and is then adhered to the base substrate 42. As a result, the base substrate 42 and the top substrate 44 house the integrated circuit chip 30 sandwiched in the flexible central region.

At least one of the base substrate 42 and the top substrate 44 includes internal terminals that electrically connect to terminals formed in the integrated circuit chip 30. The internal terminals formed in at least one of the base substrate 42 and the top substrate 44 contact the terminals formed in the integrated circuit chip 30 to be connected thereto, when the integrated circuit chip 30 is sandwiched between the base substrate 42 and the top substrate 44.

The base substrate 42 and the top substrate 44 include external terminals at positions that enable connection with an external apparatus when the integrated circuit chip 30 is housed therebetween. The external terminals are electrically connected to the internal terminals via wiring formed within the base substrate 42 and the top substrate 44.

Since this integrated circuit package 40 has a firm circumferential edge, the integrated circuit package 40 can be easily transported and mounted in the test apparatus. Furthermore, since the integrated circuit chip 30 is sandwiched in the flexible region, the integrated circuit package 40 exerts little stress on the integrated circuit chip 30.

Figure 3:
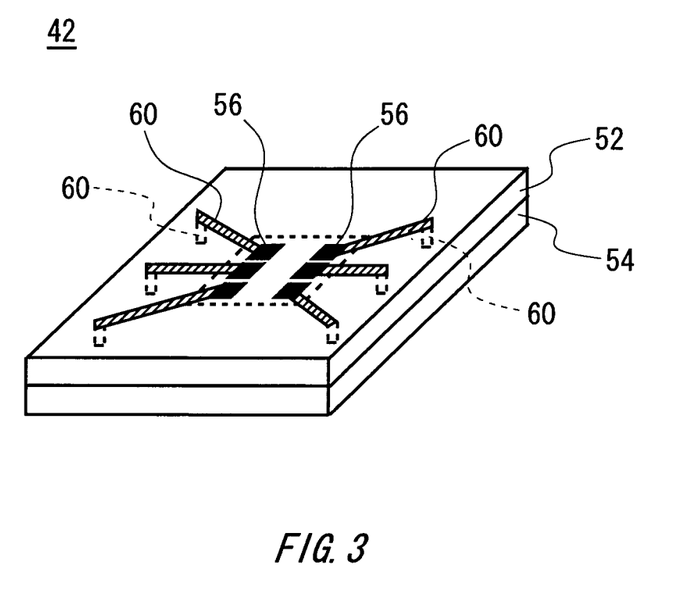
FIG. 3 shows a perspective view of the base substrate 42 as seen from a base film 52 side.
Figure 4:
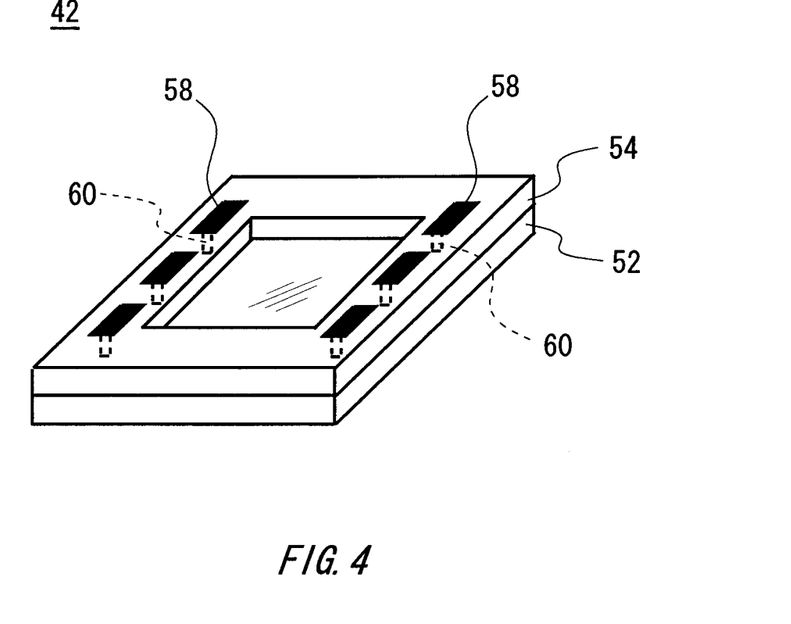
FIG. 4 shows a perspective view of the base substrate 42 as seen from a base frame substrate 54 side.

FIG. 3 shows a perspective view of the base substrate 42 as seen from a base film 52 side. FIG. 4 shows a perspective view of the base substrate 42 as seen from a base frame substrate 54 side.

The base substrate 42 may include a base film 52 and a base frame substrate 54. The base film 52 is a flexible substrate having a planar surface that is larger than the integrated circuit chip 30. A substantially central region of the base film 52 is connected to one surface of the integrated circuit chip 30.

The base frame substrate 54 is a rigid substrate that is harder than the base film 52. The base frame substrate 54 has substantially the same circumferential shape as the base film 52, and is formed as a ring-shaped thin board with an opening formed in the center thereof. The opening of the base frame substrate 54 is larger than the integrated circuit chip 30. The base frame substrate 54 is adhered to the surface of the base film 52 that is not connected to the integrated circuit chip 30, and holds the outer circumference of the base film 52.

The base film 52 includes one or more base internal terminals 56 connected to terminals of the integrated circuit chip 30. The one or more base internal terminals 56 are each formed at a position facing a terminal formed on the integrated circuit chip 30 when the integrated circuit chip 30 is connected to the base film 52.

The base frame substrate 54 includes one or more base external terminals 58 connected to an external circuit. The one or more base external terminals 58 are formed on the surface of the base frame substrate 54 that is not adhered to the base film 52. In this case, the intervals between the base external terminals 58 may be larger than the intervals between the base internal terminals 56.

The base internal terminals 56 and the base external terminals 58 are electrically connected to each other via the wiring 60 on the base film 52 and the wiring 60 on the base frame substrate 54. This base substrate 42 can provide an electric connection between an external circuit and terminals formed in the integrated circuit chip 30 when the integrated circuit chip 30 is loaded thereon.

Figure 5:
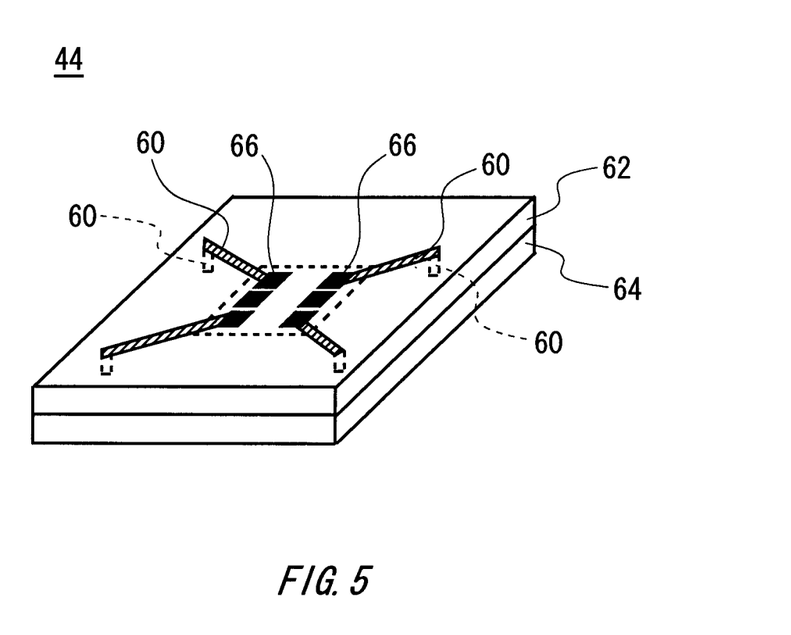
FIG. 5 is a perspective view of the top substrate 44 as seen from a top film 62 side.
Figure 6:
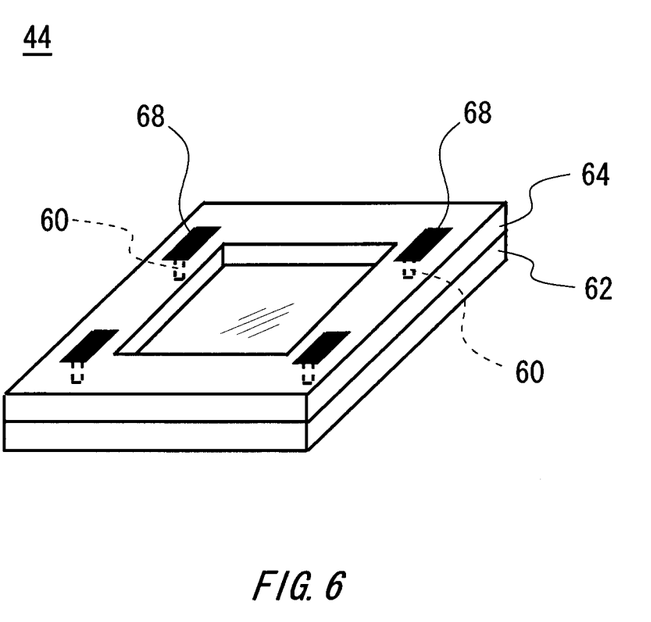
FIG. 6 is a perspective view of the top substrate 44 as seen from a top frame substrate 64 side.

FIG. 5 is a perspective view of the top substrate 44 as seen from a top film 62 side. FIG. 6 is a perspective view of the top substrate 44 as seen from a top frame substrate 64 side.

The top substrate 44 may include a top film 62 and a top frame substrate 64. The top film 62 is a flexible substrate having a planar surface that is larger than the integrated circuit chip 30. A substantially central region of the top film 62 is connected to the surface of the integrated circuit chip 30 that is not connected to the base substrate 42.

The top frame substrate 64 is a rigid substrate that is harder than the top film 62. The top frame substrate 64 has substantially the same circumferential shape as the top film 62, and is formed as a ring-shaped thin board with an opening formed in the center thereof. The opening of the top frame substrate 64 is larger than the integrated circuit chip 30. The top frame substrate 64 is adhered to the surface of the top film 62 that is not connected to the integrated circuit chip 30, and holds the outer circumference of the top film 62.

The top film 62 includes one or more top internal terminals 66 connected to terminals of the integrated circuit chip 30. The one or more top internal terminals 66 are each formed at a position facing a terminal formed on the integrated circuit chip 30 when the integrated circuit chip 30 is connected to the top film 62.

The top frame substrate 64 includes one or more top external terminals 68 connected to an external circuit. The one or more top external terminals 68 are formed on the surface of the top frame substrate 64 that is not adhered to the top film 62. In this case, the intervals between the top external terminals 68 may be larger than the intervals between the top internal terminals 66.

The top internal terminals 66 and the top external terminals 68 are electrically connected to each other via the wiring 60 on the top film 62 and the wiring 60 on the base frame substrate 54. This top substrate 44 can provide an electric connection between an external circuit and terminals formed in the integrated circuit chip 30 when the integrated circuit chip 30 is loaded thereon.

Figure 7:
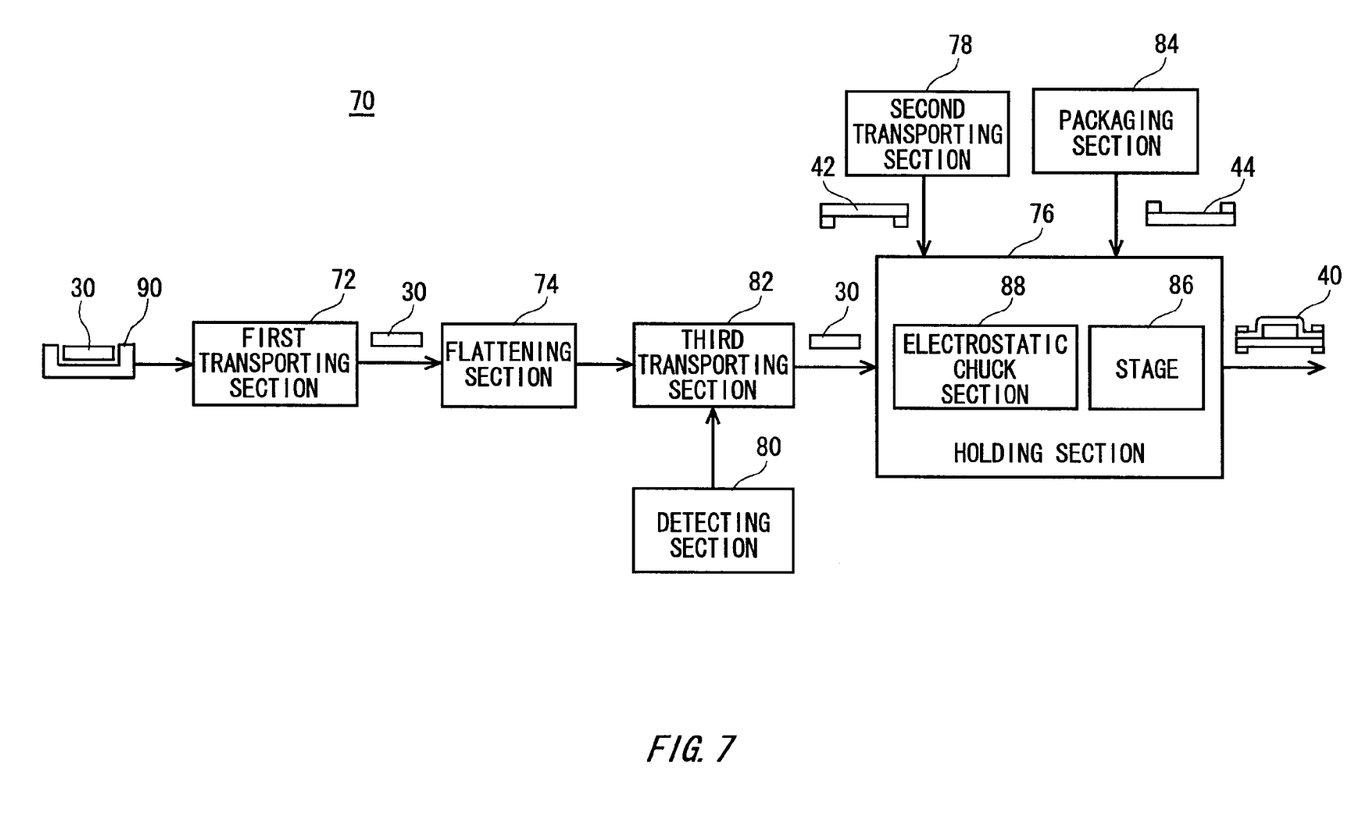
FIG. 7 shows a configuration of a manufacturing apparatus 70 according to an embodiment of the present invention.

FIG. 7 shows a configuration of a manufacturing apparatus 70 according to an embodiment of the present invention. The manufacturing apparatus 70 functions as the test package manufacturing section 14, and manufactures integrated circuit packages 40 by packaging integrated circuit chips 30.

The manufacturing apparatus 70 includes a first transporting section 72, a flattening section 74, a holding section 76, a second transporting section 78, a detecting section 80, a third transporting section 82, and a packaging section 84.

The first transporting section 72 removes an integrated circuit chip 30 from a chip tray 90 and transports this integrated circuit chip 30 to the flattening section 74. The first transporting section 72 may transport the integrated circuit chip 30 using suction generated by a vacuum chuck, for example.

The flattening section 74 flattens the integrated circuit chip 30. The flattening section 74 may include an electrostatic chuck on which the integrated circuit chip 30 is loaded. The electrostatic chuck of the flattening section 74 flattens the integrated circuit chip 30 loaded thereon using an attractive force.

The holding section 76 holds the base substrate 42 during the packaging process. The holding section 76 therefore also holds the flattened integrated circuit chip 30 loaded on the base substrate 42 during the packaging process.

The holding section 76 may include a stage 86 and an electrostatic chuck section 88. The stage 86 holds the base substrate 42 at a predetermined position. The electrostatic chuck section 88 is loaded on the stage 86, and exerts an attractive force from below the base substrate 42 on the integrated circuit chip 30 loaded on the base substrate 42, thereby holding the integrated circuit chip 30 on the base substrate 42.

The second transporting section 78 transports the base substrate 42 to the holding section 76, and the holding section 76 holds the base substrate 42. More specifically, the second transporting section 78 loads the base substrate 42 on a prescribed position of the stage 86, and holds the base substrate 42 on the stage 86.

While the integrated circuit chip 30 is being transported from the flattening section 74 to the base substrate 42, the detecting section 80 detects the position of the integrated circuit chip 30 relative to a third transporting section 82. The third transporting section 82 transports the flattened integrated circuit chip 30 and loads the integrated circuit chip 30 on the base substrate 42 held by the holding section 76. The third transporting section 82 may load the integrated circuit chip 30 on the base substrate 42 placed at a prescribed position on the stage 86. In this case, the third transporting section 82 aligns the integrated circuit chip 30 with the base substrate 42 based on the position detected by the detecting section 80, and loads the integrated circuit chip 30 onto the base substrate 42 held on the stage 86.

The packaging section 84 packages the integrated circuit chip 30 and the base substrate 42 as the integrated circuit package 40. In the present embodiment, the packaging section 84 layers the top substrate 44 on the integrated circuit chip 30 that is loaded on the base substrate 42 held by the holding section 76, thereby forming the integrated circuit package 40.

Figure 8:
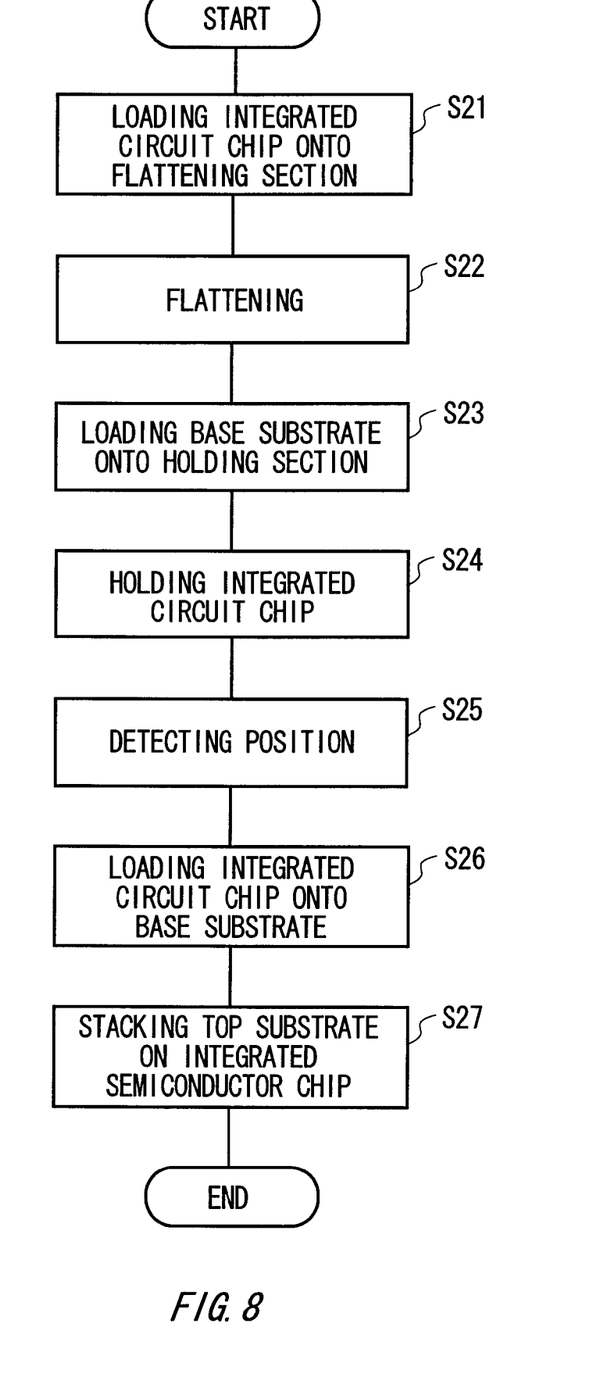
FIG. 8 shows a process flow performed by the manufacturing apparatus 70 according to the present embodiment.

FIG. 8 shows a process flow performed by the manufacturing apparatus 70 according to the present embodiment. The following describes each step in this process using FIGS. 9 to 14.

Figure 9:
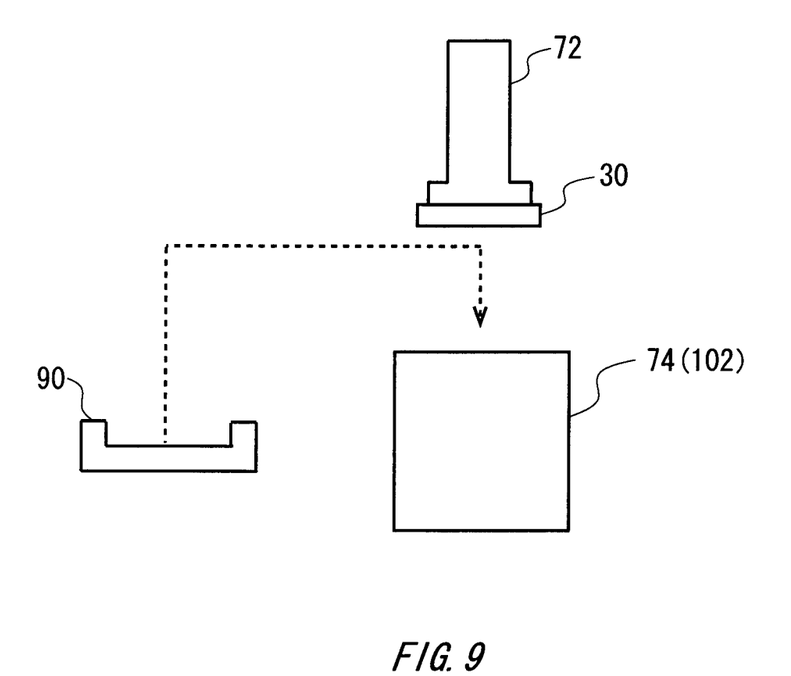
FIG. 9 shows a state in which the integrated circuit chip 30 is being transported from the chip tray 90 to the flattening section 74.

First, at step S21, the first transporting section 72 transports the integrated circuit chip 30 from the chip tray 90 to the flattening section 74, as shown in FIG. 9. The first transporting section 72 may transport the integrated circuit chip 30 using suction generated by a vacuum chuck, for example. The first transporting section 72 loads the integrated circuit chip 30 onto the electrostatic chuck 102 of the flattening section 74.

Figure 10:
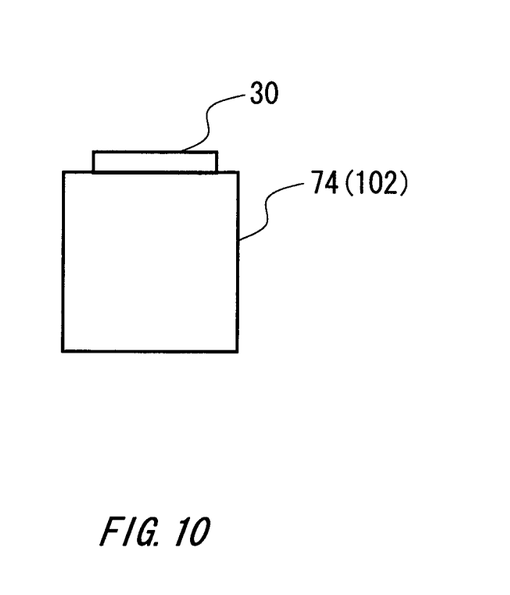
FIG. 10 shows a state in which the integrated circuit chip 30 is loaded on the flattening section 74.

Next, at step S22, the electrostatic chuck 102 of the flattening section 74 attracts the integrated circuit chip 30 for a prescribed time, as shown in FIG. 10. As a result, the electrostatic chuck 102 can flatten the integrated circuit chip 30 without warping the integrated circuit chip 30. By performing the flattening in this way, the manufacturing apparatus 70 can position the integrated circuit chip 30 accurately between the base substrate 42 and the top substrate 44 during the packaging process performed later.

Figure 11:
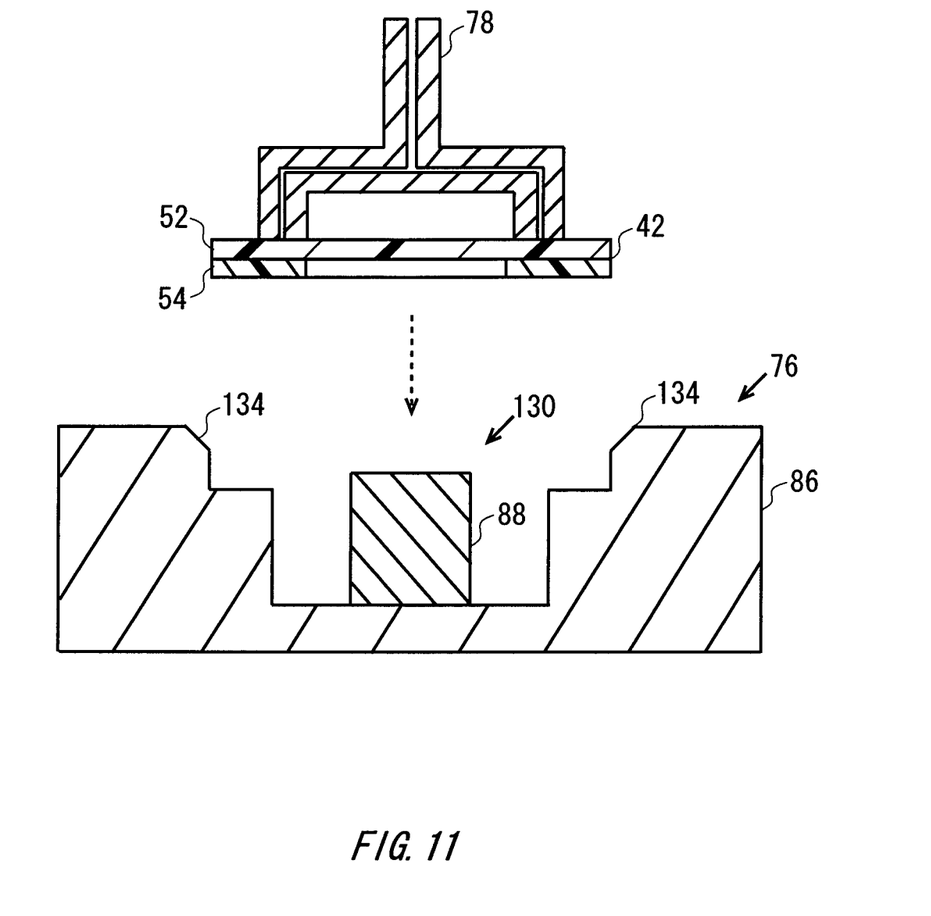
FIG. 11 shows a state in which the base substrate 42 is being transported to the stage 86.

Next, at step S23, the second transporting section 78 transports the base substrate 42 to the stage 86 of the holding section 76, as shown in FIG. 11. For example, the second transporting section 78 may transport the base substrate 42 by using a vacuum chuck to exert suction on the circumferential edge thereof.

The second transporting section 78 loads the base substrate 42 onto the stage 86 of the holding section 76. The second transporting section 78 loads the base substrate 42 onto the stage 86 such that the base film 52 is on the top and the base frame substrate 54 is on the bottom, relative to the stage 86.

Here, the stage 86 may include a substrate fixing hole 130 with an opening that has substantially the same outer shape as the base substrate 42. In this case, the second transporting section 78 loads the base substrate 42 within the substrate fixing hole 130. As a result, the stage 86 can fix the base substrate 42 at a predetermined position.

The substrate fixing hole 130 may include an incline 134 on an upper portion of the sidewalls thereof, such that the diameter of the opening expands at the top. As a result, the stage 86 can reliably insert the base substrate 42 into the substrate fixing hole 130 even if misalignment occurs during transport.

The central portion of the substrate fixing hole 130 is deeper than the circumferential edge thereof. When the base substrate 42 is inserted in the substrate fixing hole 130, the base substrate 42 is fixed at the height of the bottom of the circumferential edge.

The electrostatic chuck section 88 is provided on the bottom of the central portion of the substrate fixing hole 130. The electrostatic chuck section 88 is arranged such that the top surface thereof is at a position that is higher than the bottom of the circumferential edge of the substrate fixing hole 130 by an amount equal to the thickness of the base frame substrate 54. As a result, the electrostatic chuck section 88 can support the base substrate 42 from the base film 52 side when the base substrate 42 is inserted in the substrate fixing hole 130.

Furthermore, the electrostatic chuck section 88 exerts an attractive force from below the base substrate 42 on the integrated circuit chip 30 loaded on the base substrate 42, and can therefore hold the integrated circuit chip 30 on the base substrate 42. As a result, the electrostatic chuck section 88 can prevent misalignment during packaging in the relative positions of the base substrate 42 and the integrated circuit chip 30. The electrostatic chuck section 88 holds the integrated circuit chip 30 via attraction, and can therefore flatten the integrated circuit chip 30 if there is warping or the like remaining in the integrated circuit chip 30.

Next, at step S24, the third transporting section 82 removes the flattened integrated circuit chip 30 from the electrostatic chuck 102 of the flattening section 74. The third transporting section 82 may handle the integrated circuit chip 30 using suction from a vacuum chuck.

Figure 12:
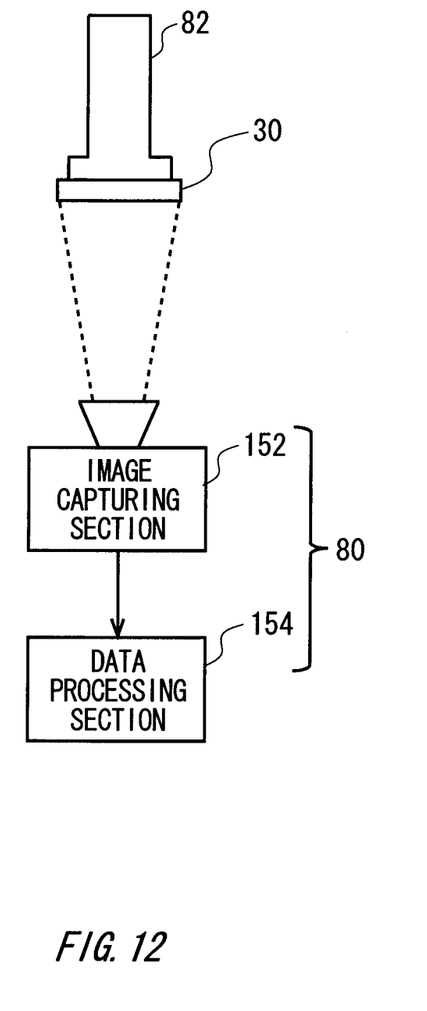
FIG. 12 shows a state in which the detecting section 80 is detecting the position of the integrated circuit chip 30 relative to the third transporting section 82.

Next, at step S25, the detecting section 80 detects the position of the integrated circuit chip 30 relative to the third transporting section 82 while the integrated circuit chip 30 is being transported from the flattening section 74 onto the base substrate 42, as shown in FIG. 12. The detecting section 80 may detect the position of a mark provided on the integrated circuit chip 30.

The detecting section 80 includes an image capturing section 152 and a data processing section 154. The image capturing section 152 captures an image of the integrated circuit chip 30 being held by the third transporting section 82. The data processing section 154 detects the position of the mark on the integrated circuit chip 30 relative to the third transporting section 82, based on the image captured by the image capturing section 152.

Figure 13:
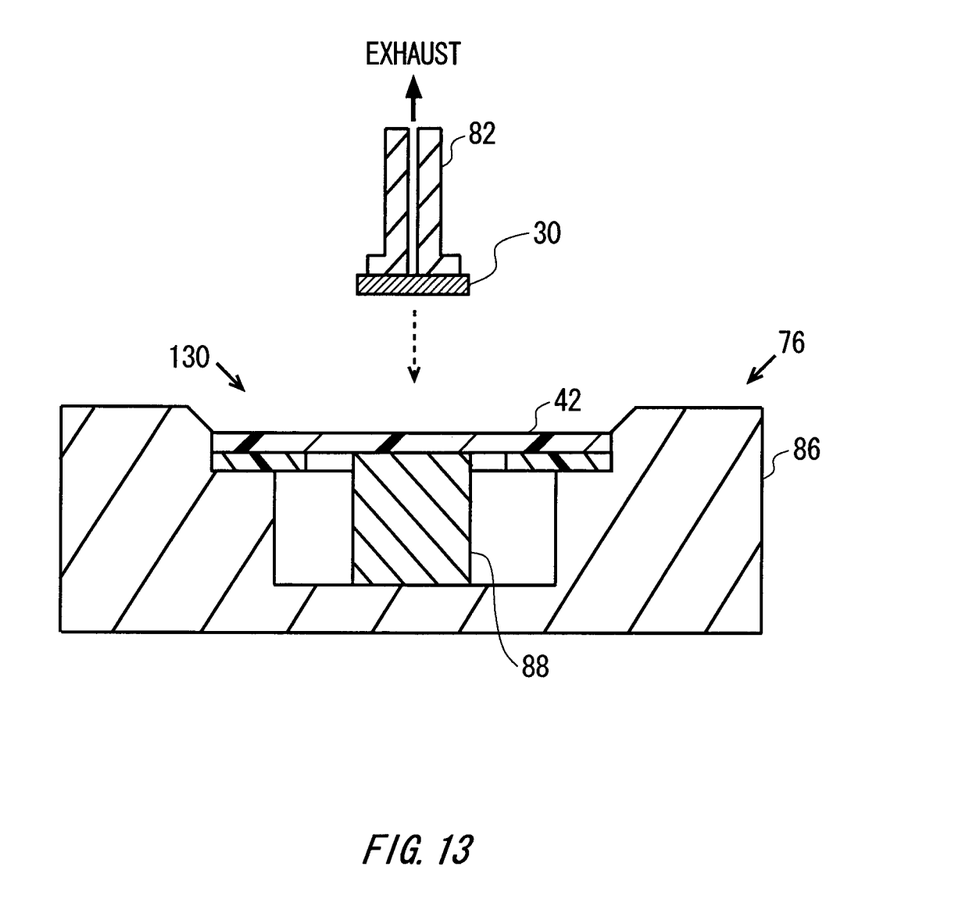
FIG. 13 shows a state in which the integrated circuit chip 30 is being transported onto the base substrate 42 held by the stage 86.

Next, at step S26, the third transporting section 82 transports the flattened integrated circuit chip 30 to the holding section 76 and loads the integrated circuit chip 30 onto the base substrate 42 inserted in the substrate fixing hole 130 of the stage 86, as shown in FIG. 13. In this case, when loading the integrated circuit chip 30 on the base substrate 42, the third transporting section 82 aligns the integrated circuit chip 30 with the base substrate 42 based on the position detected by the detecting section 80, e.g. the position of the mark detected by the detecting section 80.

The third transporting section 82 can load the integrated circuit chip 30 at a predetermined position on the base substrate 42. As a result, the third transporting section 82 can use the electrostatic chuck section 88 to exert an attractive force from below on the integrated circuit chip 30 loaded on the base substrate 42, and thereby hold the integrated circuit chip 30 at the predetermined position on the base substrate 42. Furthermore, the third transporting section 82 can connect the base internal terminals 56 of the base film 52 of the base substrate 42 to the terminals of the integrated circuit chip 30.

Figure 14:
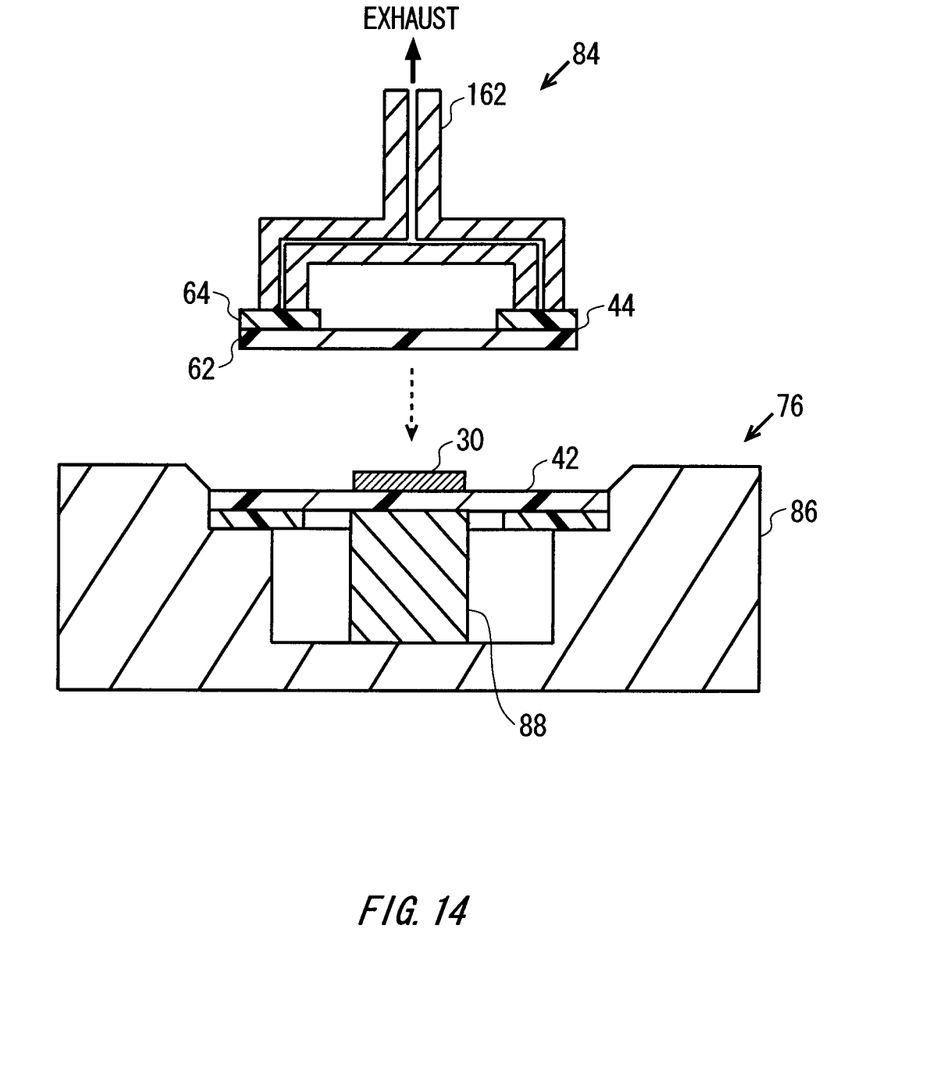
FIG. 14 shows a state in which the top substrate 44 is stacked on the integrated circuit chip 30 loaded on the base substrate 42.

Next, at step S27, the packaging section 84 packages the integrated circuit chip 30 and the base substrate 42 as the integrated circuit package 40, as shown in FIG. 14. In the present embodiment, the packaging section 84 includes a top substrate transporting section 162.

The top substrate transporting section 162 includes a vacuum chuck that holds the circumferential edge, i.e. the top frame substrate 64, of the top substrate 44 using vacuum suction. The top substrate transporting section 162 transports the held top substrate 44 onto the base substrate 42 inserted into the substrate fixing hole 130 of the stage 86. The top substrate transporting section 162 then stacks the top substrate 44 on the integrated circuit chip 30, which is loaded on the base substrate 42. In this case, the top substrate transporting section 162 stacks the top substrate 44 and the integrated circuit chip 30 such that the top film 62 is on the bottom and the top frame substrate 64 is on top, relative to the stage 86. As a result, the packaging section 84 can connect the top internal terminals 66 of the top film 62 to the terminals of the integrated circuit chip 30.

The packaging section 84 then fixes the base substrate 42 to the top substrate 44 by applying an adhesive or the like therebetween. In this case, the packaging section 84 may apply the adhesive to at least one of the base substrate 42 and the top substrate 44 prior to stacking the top substrate 44 on the integrated circuit chip 30, or may apply the adhesive to the edge of the top substrate 44 after stacking.

The manufacturing apparatus 70 can manufacture the integrated circuit package 40 using the process from step S21 to step S27 described above. With this manufacturing apparatus 70, the integrated circuit chip 30 is flattened by a vacuum chuck or the like prior to the packaging process, and so the resulting integrated circuit package 40 has accurate connection between the substrates and the integrated circuit chip 30.

Figure 15:
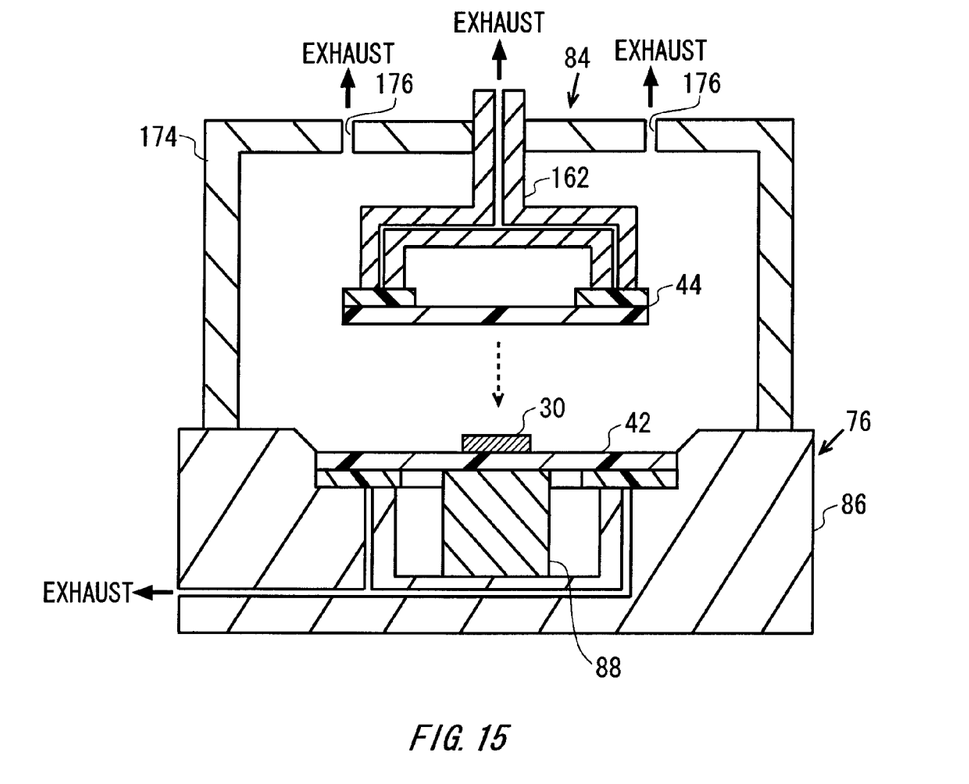
FIG. 15 shows an integrated circuit chip 30 loaded on the base substrate 42 and stacked on the top substrate 44 by a packaging section 84 having another configuration.

FIG. 15 shows an integrated circuit chip 30 loaded on the base substrate 42 on which the top substrate 44 is to be stacked by a packaging section 84 having another configuration. This packaging section 84 may include a top substrate transporting section 162, an external wall 174, and exhaust sections 176.

The external wall 174, together with the stage 86, forms a low-pressure space covering the base substrate 42, the integrated circuit chip 30, and the top substrate 44. The exhaust sections 176 eject gas in the low-pressure space formed by the external wall 174 and the stage 86 to the outside.

During packaging, the packaging section 84 with this configuration reduces the pressure in the space where the integrated circuit chip 30 is provided between the base film 52 of the base substrate 42 and the top film 62 of the top substrate 44, and covers the top of the integrated circuit chip 30 with the top film 62. As a result, the packaging section 84 can remove the gas between the base substrate 42 and the top substrate 44 to form the integrated circuit package 40 with a firm seal between the base substrate 42 and the top substrate 44. Accordingly, the packaging section 84 can form the integrated circuit package 40 without using an adhesive or the like to affix the base substrate 42 and the top substrate 44.

When decreasing the pressure in the space where the integrated circuit chip 30 is provided, the stage 86 may exert a suction force on the base substrate 42 from below to fix the base substrate 42 on the stage 86. As a result, the stage 86 can prevent misalignment of the base substrate 42.

Figure 16:
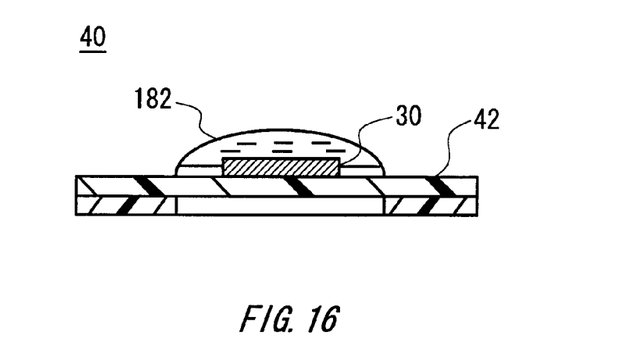
FIG. 16 shows an integrated circuit package 40 in which a gel 182 is used instead of the top substrate 44 to cover the integrated circuit chip 30 loaded on the base substrate 42.

FIG. 16 shows an integrated circuit package 40 in which a gel 182 is used instead of the top substrate 44 to cover the integrated circuit chip 30 loaded on the base substrate 42. The integrated circuit package 40 may use the gel 182 as a cover instead of the top substrate 44. In other words, the integrated circuit package 40 may be configured such that the gel 182 covers the integrated circuit chip 30 loaded on the base substrate 42.

In this case, the process of step S27 involves the packaging section 84 supplying the gel 182 onto the integrated circuit chip 30 from above. As a result, the packaging section 84 can cover the integrated circuit chip 30 loaded on the base substrate 42 with the gel from a side opposite the base substrate 42. The integrated circuit package 40 having this configuration decreases the stress on the integrated circuit chip 30.

Figure 17:
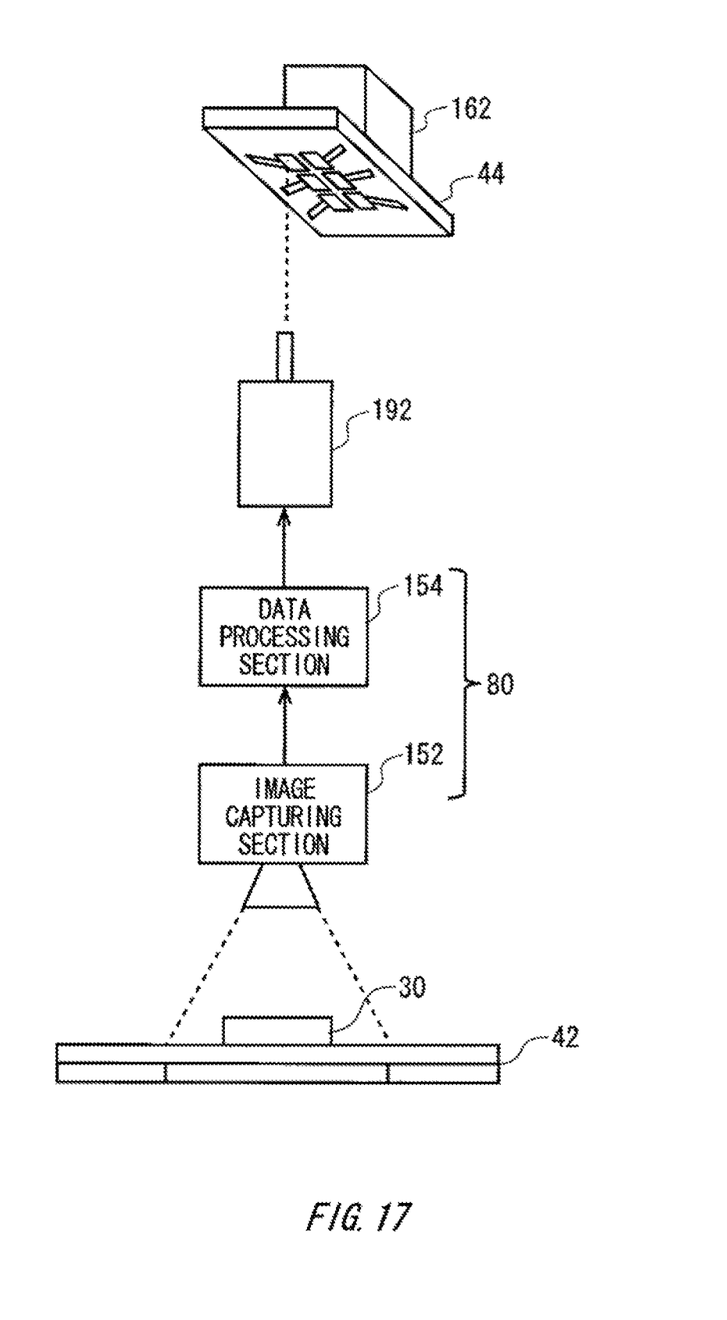
FIG. 17 shows a state in which the third transporting section 82 prints wiring on the top substrate 44.

FIG. 17 shows a state in which the printing section 192 prints wiring on the top substrate 44. The packaging section 84 may include a printing section 192 that prints at least a portion of the top internal terminals 66 of the top substrate 44.

In this case, the process of step S27 involves the top substrate transporting section 162 of the packaging section 84 holding the top substrate 44 with the vacuum chuck or the like, and the detecting section 80 then detecting the position of the integrated circuit chip 30 loaded on the base substrate 42.

Next, while the top substrate 44 is being handled by the top substrate transporting section 162, the printing section 192 prints at least a portion of the top internal terminals 66 on the top substrate 44 according to the position of the integrated circuit chip 30 detected by the detecting section 80. The packaging section 84 then stacks the top substrate 44 on which the top internal terminals 66 are printed onto the integrated circuit chip 30 loaded on the base substrate 42, thereby forming the integrated circuit package 40.

In this way, the packaging section 84 can print the top internal terminals 66 at positions corresponding to the terminals of the integrated circuit chip 30 loaded on the top substrate 44. Accordingly, even when the top substrate transporting section 162 holds the top substrate 44 at an incline, for example, the packaging section 84 can enable an accurate connection between the terminals of the integrated circuit chip 30 and the top internal terminals 66.

Prior to the packaging section 84 loading the integrated circuit chip 30 on the base substrate 42 at step S23, the printing section 192 may be used to print at least a portion of the base internal terminals 56 for the base substrate 42 according to the position of the integrated circuit chip 30 detected by the detecting section 80. As a result, the packaging section 84 can print the base internal terminals 56 at positions corresponding to the terminals of the integrated circuit chip 30 loaded on the base substrate 42. Accordingly, even when the third transporting section 82 holds the integrated circuit chip 30 at an incline, for example, the packaging section 84 can enable an accurate connection between the terminals of the integrated circuit chip 30 and the base internal terminals 56.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A manufacturing apparatus that manufactures an integrated circuit package by packaging an integrated circuit chip, the manufacturing apparatus comprising:
    a flattening section that flattens the integrated circuit chip;
    a holding section that holds a base substrate;
    a transporting section that transports the flattened integrated circuit chip to load the integrated circuit chip on the base substrate held by the holding section; and
    a packaging section that packages the integrated circuit chip and the base substrate as the integrated circuit package, wherein
    the packaging section stacks a top substrate on the integrated circuit chip loaded onto the base substrate.

2. The manufacturing apparatus according to claim 1, wherein
    the holding section includes an electrostatic chuck section that exerts an attractive force from below the integrated circuit chip loaded on the base substrate to hold the integrated circuit chip on the base substrate.

3. The manufacturing apparatus according to claim 1, wherein
    the flattening section has the integrated circuit chip loaded thereon and flattens the integrated circuit chip by applying an attractive force thereto.

4. The manufacturing apparatus according to claim 3, wherein
    the flattening section includes an electrostatic chuck that exerts an attractive force on the integrated circuit chip loaded thereon.

5. The manufacturing apparatus according to claim 1, comprising a vacuum chuck that exerts an attractive force on the integrated circuit chip flattened by the flattening section.

6. The manufacturing apparatus according to claim 5, further comprising a detecting section that detects a position of the integrated circuit chip relative to the transporting section while the integrated circuit chip is transported from the flattening section onto the base substrate, wherein
    the transporting section aligns the integrated circuit chip with the base substrate, based on the position detected by the detecting section, and loads the aligned integrated circuit chip onto the base substrate.

7. The manufacturing apparatus according to claim 6, wherein
    the detecting section detects a position of a mark provided on the integrated circuit chip, and
    the transporting section aligns the integrated circuit chip with the base substrate, based on the position of the mark detected by the detecting section, and loads the aligned integrated circuit chip onto the base substrate.

8. The manufacturing apparatus according to claim 1, wherein
    the base substrate includes:
        a base film that has a base internal terminal to be connected to the integrated circuit chip; and
        a base frame substrate that has a base external terminal connected to a circuit outside the integrated circuit package and that holds an outer circumference of the base film, and
    the base internal terminal and the base external terminal are electrically connected to each other via wiring on the base film and wiring on the base frame substrate.

9. The manufacturing apparatus according to claim 8, wherein
    the top substrate includes a top film that has top internal terminals to be connected to the integrated circuit chip, and
    the packaging section connects the top internal of the top film to terminals of the integrated circuit chip.

10. The manufacturing apparatus according to claim 9, wherein
    the top substrate includes a top frame substrate that has top external terminals connected to a circuit outside of the integrated circuit package and that holds an outer circumference of the top film, and
    the top internal terminals and the top external terminals are electrically connected to each other via wiring on the top film and wiring on the top frame substrate.

11. The manufacturing apparatus according to claim 9, wherein
    the packaging section reduces pressure of a space in which the integrated circuit chip is provided between the base film and the top film to cover the integrated circuit chip with the top film from above.

12. The manufacturing apparatus according to claim 11, wherein
    the holding section includes a stage onto which an electrostatic chuck section is loaded, and
    the packaging section includes:
        a top substrate transporting section that holds and transports the top substrate;

an external wall that, together with the stage, forms a low-pressure space covering the base substrate, the integrated circuit chip, and the top substrate; and an exhaust section that ejects gas within the low-pressure space to the outside.

13. The manufacturing apparatus according to claim 9, further comprising a detecting section that detects a position of the integrated circuit chip loaded on the base substrate, wherein the packaging section includes a printing section that prints at least a portion of the top internal terminals on the top substrate, according to the position detected by the detecting section.

14. A test apparatus that tests an integrated circuit chip, comprising:

the manufacturing apparatus according to claim that manufactures the integrated circuit package by packaging the integrated circuit chip in a manner to be tested; and a testing section that tests the integrated circuit chip packaged in the integrated circuit package.

15. The test apparatus according to claim 14, further comprising a removing section that removes the tested integrated circuit chip from the integrated circuit package.

16. A manufacturing method for manufacturing an integrated circuit package by packaging an integrated circuit chip, the manufacturing method comprising:

flattening the integrated circuit chip with a flattening section;

holding a base substrate with a holding section;

transporting the flattened integrated circuit chip with a transporting section to load the integrated circuit chip on the base substrate held by the holding section; and packaging the integrated circuit chip and the base substrate as the integrated circuit package, using a packaging section, wherein the packaging includes stacking a top substrate on the integrated circuit chip loaded onto the base substrate.

* * * * *